United States Patent
Washio et al.

(10) Patent No.: US 8,471,586 B2
(45) Date of Patent: Jun. 25, 2013

(54) WAFER PROBER FOR SEMICONDUCTOR INSPECTION AND INSPECTION METHOD

(75) Inventors: Kenichi Washio, Tokyo (JP); Katsuo Yasuta, Tokyo (JP); Umenori Sugiyama, Tokyo (JP); Hikaru Masuta, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 419 days.

(21) Appl. No.: 12/816,834

(22) Filed: Jun. 16, 2010

(65) Prior Publication Data

US 2011/0018564 A1    Jan. 27, 2011

(30) Foreign Application Priority Data

Jul. 27, 2009 (JP) ................................ 2009-174657

(51) Int. Cl.
*G01R 31/26* (2006.01)
(52) U.S. Cl.
USPC .................................................... 324/762.01
(58) Field of Classification Search
USPC ............. 324/762.01–762.1, 754.01–754.3, 324/755.01–755.1; 257/48
See application file for complete search history.

(56) References Cited

U.S. PATENT DOCUMENTS 7,701,236 B2 * 4/2010 Akiyama et al. ......... 324/750.16

FOREIGN PATENT DOCUMENTS

| JP | 62-262438 | 11/1987 |
| JP | 2003-151999 | 5/2003 |
| JP | 2005-093612 | 4/2005 |
| JP | 2005-101584 | 4/2005 |

* cited by examiner

*Primary Examiner* — Tung X Nguyen
(74) *Attorney, Agent, or Firm* — Bacon & Thomas, PLLC

(57) ABSTRACT

A wafer prober is provided with a tray which supports a wafer at a set position, transports it to a processing position of the wafer and is placed at the processing position; one or more alignment units which position the wafer at the set position with respect to the tray; contact units arranged in number larger than that of the alignment units and performing inspection processing in contact with the wafer at the processing position; and a tray transport portion for transporting the tray supporting the wafer between the alignment unit and the contact unit. The tray is provided with three or more pin holes for allowing movement of the chuck pin in the XYZθ directions, an alignment mark for positioning the wafer, and an alignment portion for positioning the tray itself.

10 Claims, 19 Drawing Sheets

WAFER PROBER FOR SEMICONDUCTOR INSPECTION AND INSPECTION METHOD

CROSS-REFERENCE TO RELATED APPLICATION

This application claims, under 35 USC 119, priority of Japanese Application No. 2009-174657 filed Jul. 27, 2009.

BACKGROUND OF THE INVENTION

1. Technical Field

The present invention relates to a wafer prober for semiconductor inspection and an inspection method that can position an inspection target to be placed on a tray with respect to the tray and inspect a plurality of the inspection targets at the same time while transporting them with the tray and can accurately position a probe card with respect to the inspection target at inspection.

2. Background Art

A prober for inspecting a wafer or the like as an inspection target is provided with an alignment unit for aligning the wafer or the like and a contact unit for performing an inspection in contact with the wafer or the like. Moreover, the alignment unit and the contact unit are both provided with a camera for accurate positioning and an XYZθ stage for fine adjustment in the XYZθ directions on the basis of an image of the camera.

Chucks on which the wafer or the like is placed include those provided with suction holes for sucking and supporting the wafer or the like or a supporting pin for lifting up the wafer or the like in loading or unloading the wafer or the like as shown in Japanese Patent Laid-Open No. 2005-93612.

Also, as shown in Japanese Patent Laid-Open No. 2003-151999, some of them are provided with a wafer ring for aligning the wafer or the like held on a table by rotation, the table having an alignment mark for alignment of the wafer or the like.

SUMMARY OF THE INVENTION

A usual prober is provided with an alignment unit for alignment of a wafer or the like and a contact unit for inspection in contact with the wafer or the like in each system, but since these units are both expensive, if a single prober is provided with these two units, respectively, a manufacturing cost would be increased.

Also, since these two units are components in a category of larger components in all the components constituting a prober, they prevent size reduction and space saving of the prober.

In the contact unit, a camera is provided for alignment of a wafer or the like based on an alignment mark made on a table, and a suction mechanism is provided for supporting the wafer or the like, but since the camera and the like are expensive, a manufacturing cost will be raised. Also, if a plurality of cameras are to be provided, they will make a bulky configuration together with their peripheral devices, which prevents size reduction and space saving and results in a problem.

Moreover, since a single prober is provided with an alignment unit and a contact unit, while the wafer or the like is aligned by the alignment unit, the contact unit is not working, and while the contact unit is conducting inspection, the alignment unit is not working. Thus, the non-working time is useless, which results in a problem of low work efficiency.

Also, there has been no such system that indirect alignment between the probe card and the wafer is made in advance using a tray, and a system capable of efficiently processing a large number of wafers is in demand.

The present invention was made in view of the above problems and has an object to provide a wafer prober for semiconductor inspection and an inspection method capable of reducing a manufacturing cost and the size of the device, saving a space, reduction of a non-working time of the device, efficient processing of a large number of wafers and improvement of work efficiency.

A wafer prober for semiconductor inspection according to the present invention includes a tray which supports a wafer at a set position and transports it to a processing position of the wafer and is installed at the processing position, one or more alignment units which position the wafer at the set position with respect to the tray, a contact unit arranged in number larger than that of the alignment units, for performing inspection and processing in contact with the wafer at the processing position, and a tray transport portion which transports the tray supporting the wafer between the alignment unit and the contact unit.

The inspection method for using the wafer prober for semiconductor inspection according to the present invention is characterized by positioning the wafer at the set position with respect to the tray by means of the alignment unit, selectively transporting the tray which supports the wafer to the contact unit arranged in number larger than that of the alignment units by the tray transport portion and performing inspection at the same time in contact with the wafer by the plurality of contact units.

According to the present invention, since the wafer is positioned with respect to the tray and transported to the contact unit together with the tray so as to be positioned together with the tray without using the XYZθ stage, expensive components such as the XYZθ stage and a camera can be reduced, and a manufacturing cost can be lowered.

Also, by a portion made available by reduction of the XYZθ stage and the camera, size reduction and space saving of the device can be promoted.

Moreover, since the contact units are arranged in number larger than that of the alignment units so that the non-working time of each device is reduced, work efficiency can be improved.

DESCRIPTION OF THE REFERRED EMBODIMENTS

A wafer prober for semiconductor inspection and an inspection method for using the wafer prober for semiconductor inspection according to an embodiment of the present invention will be described below referring to the attached drawings.

The embodiment of the present invention will be described below. In the invention according to the embodiment, a wafer can be indirectly positioned by directly positioning the tray with respect to a contact unit through positioning and fixation of the wafer to the tray. That is, positioning of the wafer is substituted by positioning of the tray. As a result, by positioning the tray through fitting between an alignment portion disposed on the tray and a positioning pin disposed on the probe card side, the wafer can be positioned with respect to the probe card. As a result, an alignment camera can also position the wafer without using an alignment stage. Thus, it is no longer necessary to provide an alignment camera or an alignment stage on the contact unit side. As a result, the contact unit can be made a small-sized device without an alignment camera or an alignment stage and by aligning a large number of small-sized contact units, an entire prober can be made compact. That is, the wafer prober for semiconductor inspection of the present invention is a device which realizes size reduction, space saving and lower cost. The device will be described below in detail.

[Wafer Prober for Semiconductor Inspection]

Figure 1:
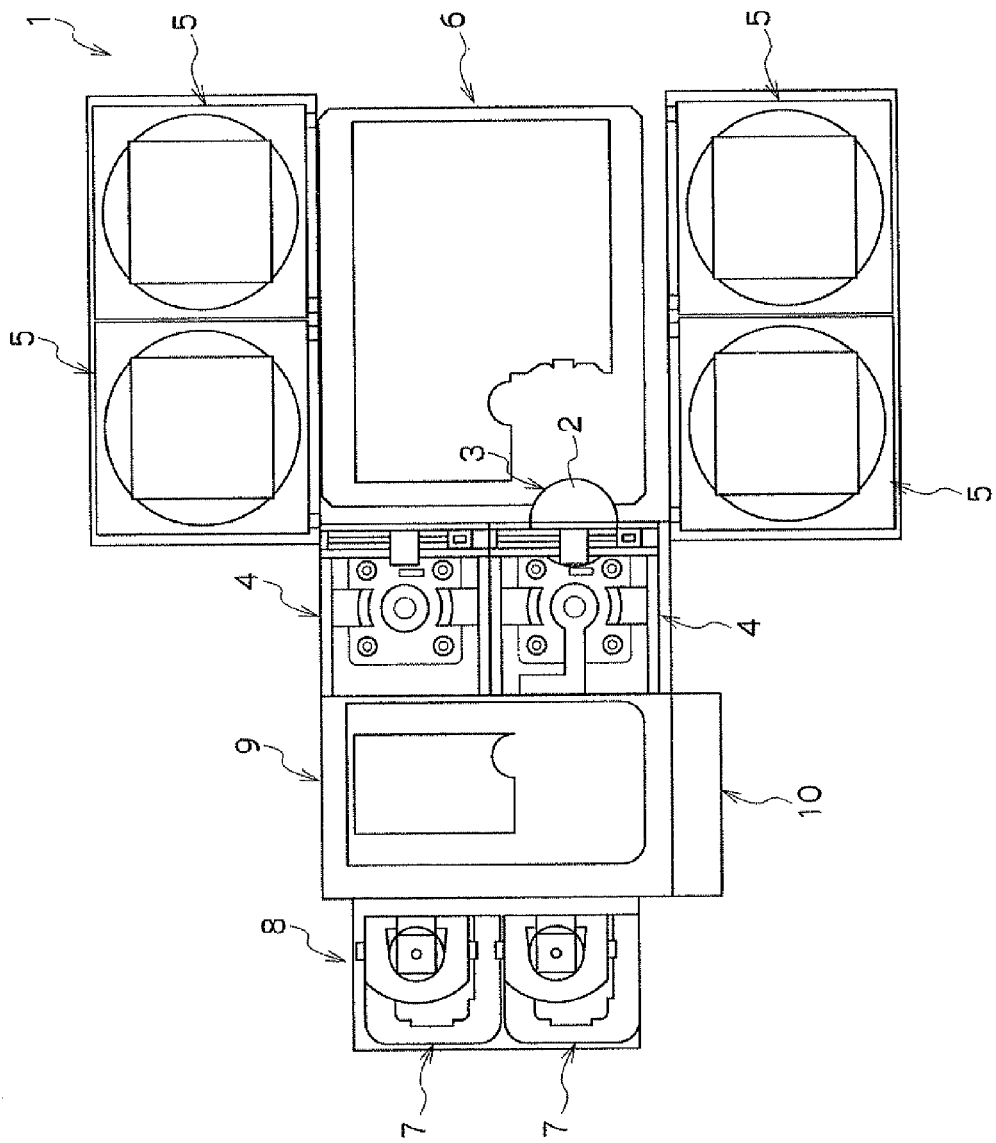
FIG. 1 is an outline configuration diagram illustrating a wafer prober for semiconductor inspection according to an embodiment of the present invention.

A prober 1 of this embodiment is a wafer prober for semiconductor inspection. This prober 1 includes, as shown in FIG. 1, a tray 3 supporting a wafer 2 at a set position and transported to a processing position and installed at the processing position, one or more (two in this embodiment) alignment units 4 for positioning the wafer 2 at the set position with respect to the tray 3, contact units 5 arranged in number larger than (four in this embodiment) that of the alignment units 4 and performing inspection processing by bringing a probe needle of a probe card into contact with an electrode of the wafer 2 supported by the tray 3 at the processing position, a tray transport portion 6 for transporting the tray 3 supporting the wafer 2 between the alignment unit 4 and the contact unit 5, a wafer cassette portion 8 for placing wafer cassettes 7 transported from outside, a wafer transport portion 9 for transporting the wafer 2 between the wafer cassette portion 8 and the alignment unit 4, and a control portion 10 controlling the entirety.

The tray 3 is a member for supporting the wafer 2 at the set position on its upper side face. The tray 3 is formed in a disk shape as shown in FIGS. 2 to 6. The tray 3 supporting the wafer 2 is transported between the alignment unit 4 and the contact unit 5, installed at the contact unit 5, which is the processing position, and applied with inspection processing for the wafer 2. The tray 3 mainly includes pin holes 11, alignment marks 12, alignment portions 13, and suction grooves 14. The alignment portions 13 constitute contact unit positioning means for positioning the tray 3 with respect to the contact unit 5.

Each pin hole 11 is a hole through which a chuck pin 17, which will be described later, for position adjustment of the wafer 2 is inserted. An inner diameter of the pin hole 11 is formed larger than an outer diameter of the chuck pin 17 so as to allow movement of the chuck pin 17 in XYZθ directions. A dimensional difference between the inner diameter of the pin hole 11 and the outer diameter of the chuck pin 17 is set according to a movement amount required for fine adjustment of the wafer 2. Three or more pin holes 11 are provided. In this embodiment, three pin holes 11, which are the minimum number that can stably support the wafer 2, are disposed at apex positions of a regular triangle, respectively.

Each alignment mark 12 is a mark photographed by a camera 20, which will be described later, together with a mark on the wafer 2 side when the wafer 2 placed on the tray 3 is positioned. When the wafer 2 is positioned with respect to the tray 3, the wafer 2 supported by the chuck pin 17 is finely adjusted by moving it by an XYZθ stage 18 so that the mark on the wafer 2 side matches the alignment marks 12 on the tray 3 side.

Each alignment portion 13 is positioning means for positioning the tray 3 in the contact unit 5 with respect to a probe card 40, which will be described later. The alignment portion 13 is configured by a V-groove. Three V-grooves are disposed with the orientations of the grooves displaced by 120 degrees each. By fitting three positioning pins 41 on the contact unit 5 side, which will be described later, in the V-grooves displaced by 120 degrees each, the tray 3 is positioned at three positions displaced by 120 degrees each. As a result, the tray 3 is positioned with respect to the contact unit 5, and the wafer 2 placed at the set position on the tray 3 is positioned with respect to the probe card 40 of the contact unit 5.

Each suction groove 14 is a groove for sucking and supporting the wafer 2 placed on the upper side face of the tray 3. Three suction grooves 14 are formed concentrically on the upper side face of the tray 3.

Inside the tray 3, a vacuum chamber (not shown) is provided. This vacuum chamber is configured to communicate with the suction grooves 14 and to suck and support the wafer 2 placed on the tray 3 through the suction grooves 14. The vacuum chamber has its inside kept vacuum by a check valve (not shown) in a state with the suction grooves 14 covered by the wafer 2. On the alignment unit 4 side, a vacuum pump (not shown) having a connecting jig (not shown) to be fitted with the check valve is disposed. As the check valve, the connecting jig and the like, those well known can be used as they are. When the tray 3 is installed on the alignment unit 4, the connecting jig of the vacuum pump is fitted with the check valve so that the vacuum chamber of the tray 3 communicates with the vacuum pump.

Each alignment unit 4 is a device for positioning the wafer 2 placed on the tray 3 at the set position with respect to the tray 3. The two alignment units 4 are disposed in the same lateral direction as the alignment of the wafer cassette portion 8. Each alignment unit 4 mainly includes a base plate 16, the chuck pin 17, the XYZθ stage 18, a tray holder 19, the camera 20, a camera driving portion 21, and the vacuum pump (not shown). The XYZθ stage 18, the camera 20, the camera driving portion 21 and the like configure the wafer positioning means for positioning the wafer 2 with respect to the tray 3.

The base plate 16 is a plate material for supporting the entirety. On the base plate 16, the chuck pin 17 or the like is mounted.

The chuck pin 17 is a member inserted through the pin hole 11 of the tray 3 for supporting the wafer 2 on the tray 3 from below. The chuck pin 17 is configured by three pin portions 17A in compliance with the three pin holes 11 of the tray 3. These three pins are formed integrally, support the wafer 2 in a state inserted through the pin holes 11 and adjust the position of the wafer 2 by being moved in the same direction at the same time. An outer diameter of the chuck pin 17 is formed smaller than the pin hole 11. As a result, the chuck pin 17 can be moved in the XYZθ directions in the state inserted through the pin hole 11. As a result, the wafer 2 supported in a state floating from the tray 3 by the chuck pin 17 is displaced within a moving range of the chuck pin 17 in the XYZθ directions (within an inner diameter range of the pin hole 11) and adjusted so as to match the set position.

The XYZθ stage 18 is a device for supporting the chuck pin 17 and moving the three pin portions 17A in the XYZθ directions within the three pin holes 11 of the tray 3. As the XYZθ stage 18, the XYZθ stage used in a usual inspecting device can be used. The XYZθ stage 18 is fixed to the base plate 16.

The tray holder 19 is a member for supporting the tray 3 by the upper side of the XYZθ stage 18. The tray holder 19 is formed in an arch shape. That is, the tray holder 19 is formed in an arch shape so as to cover the upper side of the XYZθ stage 18 with a clearance from the XYZθ stage 18. The arch-shaped tray holder 19 is divided at a portion where the tray 3 is placed.

The tray holder 19 is fixed to the base plate 16 in a state covering the XYZθ stage 18. The installation position of the tray 3 in the tray holder 19 is a position where the three pin holes 11 of the tray 3 and the three pin portions 17A of the chuck pin 17 match each other. Since the XYZθ stage 18 can match the three pin portions 17A with the three pin holes 11 by moving the chuck pin 17 in the XYZθ directions, the installation position of the tray 3 may be set or may not be set accurately.

The camera 20 is a camera for photographing the alignment marks of the wafer 2 supported by the chuck pin 17 and of the tray 3 and positioning the wafer 2 with respect to the tray 3. As the camera 20, a double focus camera is used, and the mark of the wafer 2 and the alignment marks 12 of the tray 3 can be photographed at the same time. By photographing the mark of the wafer 2 and the alignment marks 12 of the tray 3 by this camera 20 and matching the images with each other, the wafer 2 is positioned at the installation position of the tray 3. Here, various marks can be used as the alignment mark on the wafer 2 side. If an orientation flat or the like is disposed on the wafer 2, it can be used, but recently, the orientation flat or mark on the wafer upper side face might not be provided in order to increase the number of chips formed on the wafer as much as possible. In this case, a specific chip or the like formed on the wafer upper side face can be used as the alignment mark. Those which are located at determined positions on the upper side faces of all the wafers 2 to be inspected and can be photographed by the camera 20 can be used as the alignment mark.

The camera driving portion 21 is a device for moving the camera 20 to a predetermined position on the upper side of the wafer 2 and the tray 3. The camera driving portion 21 is configured by an X-axis driving mechanism 23 and a Y-axis driving mechanism 24.

The X-axis moving mechanism 23 is a device for moving the camera 20 in the X-axis direction. The X-axis moving mechanism 23 is configured by a slide plate 25 and an X-axis driving portion 26. The slide plate 25 is a member for supporting and moving the camera 20 in the X-axis direction. The X-axis driving portion 26 is a device for supporting and moving the slide plate 25 in the X-axis direction. The X-axis driving portion 26 includes a rail portion 27 for slidably supporting the slide plate 25 and a slide driving portion 28 for sliding the slide plate 25 supported by the rail portion 27. The slide driving portion 28 includes a nut portion (not shown) fixed to a lower side face of the slide plate 25, a screw rod portion 29 disposed in the X-axis direction and moving the slide plate 25 in the X-axis direction through the nut portion by being screwed into the nut portion and rotated, and a driving motor 30 for rotating and driving the screw rod portion 29. The driving motor 30 is connected to the control portion 10 and controlled according to movement of the camera 20.

The Y-axis moving mechanism 24 is a device for moving the X-axis driving portion 26 in the Y-axis direction. The Y-axis moving mechanism 24 includes a slide plate 32 and a Y-axis driving portion 33. The slide plate 32 is a member fixed to both sides of the X-axis driving portion 26 so as to support the X-axis driving portion 26 from the both sides and to move it in the Y-axis direction. The Y-axis driving portion 33 is a device for supporting the slide plate 32 and moving it in the Y-axis direction. The Y-axis driving portion 33 includes a rail portion 34 for slidably supporting the slide plate 32 and a slide driving portion (not shown) for sliding the slide plate 32 supported by the rail portion 34. The rail portion 34 is disposed on both sides of the base plate 16 so as to support the X-axis driving portion 26 from the both sides. The slide driving portion is controlled according to the movement of the camera 20 using the configuration similar to the slide driving portion 28, a direct driving mechanism and the like.

The vacuum pump is a device for vacuuming the vacuum chamber of the tray 3. The vacuum pump is installed around the alignment unit 4 or the like. A connection jig (not shown) of a pipeline of this vacuum pump is configured to be fitted with the check valve of the vacuum chamber of the tray 3 so as to vacuum the inside of the vacuum chamber.

Each contact unit 5 is a device for performing inspection in contact with the electrode of the wafer 2. The four contact units 5, larger than the number of the alignment units 4, are disposed as shown in FIG. 1. The four contact units 5 are disposed two each in the direction orthogonal to the alignment of the alignment units 4 in compliance with the both end positions of the two aligned alignment units 4. The two each of aligned contact units 5 are disposed so as to oppose each other with the tray transport portion 6 between them. As a result, the alignment units 4 and the contact units 5 are formed in the U shape, and the tray 3 can be moved between the alignment units 4 and the contact units 5 in a short distance.

Figure 7:
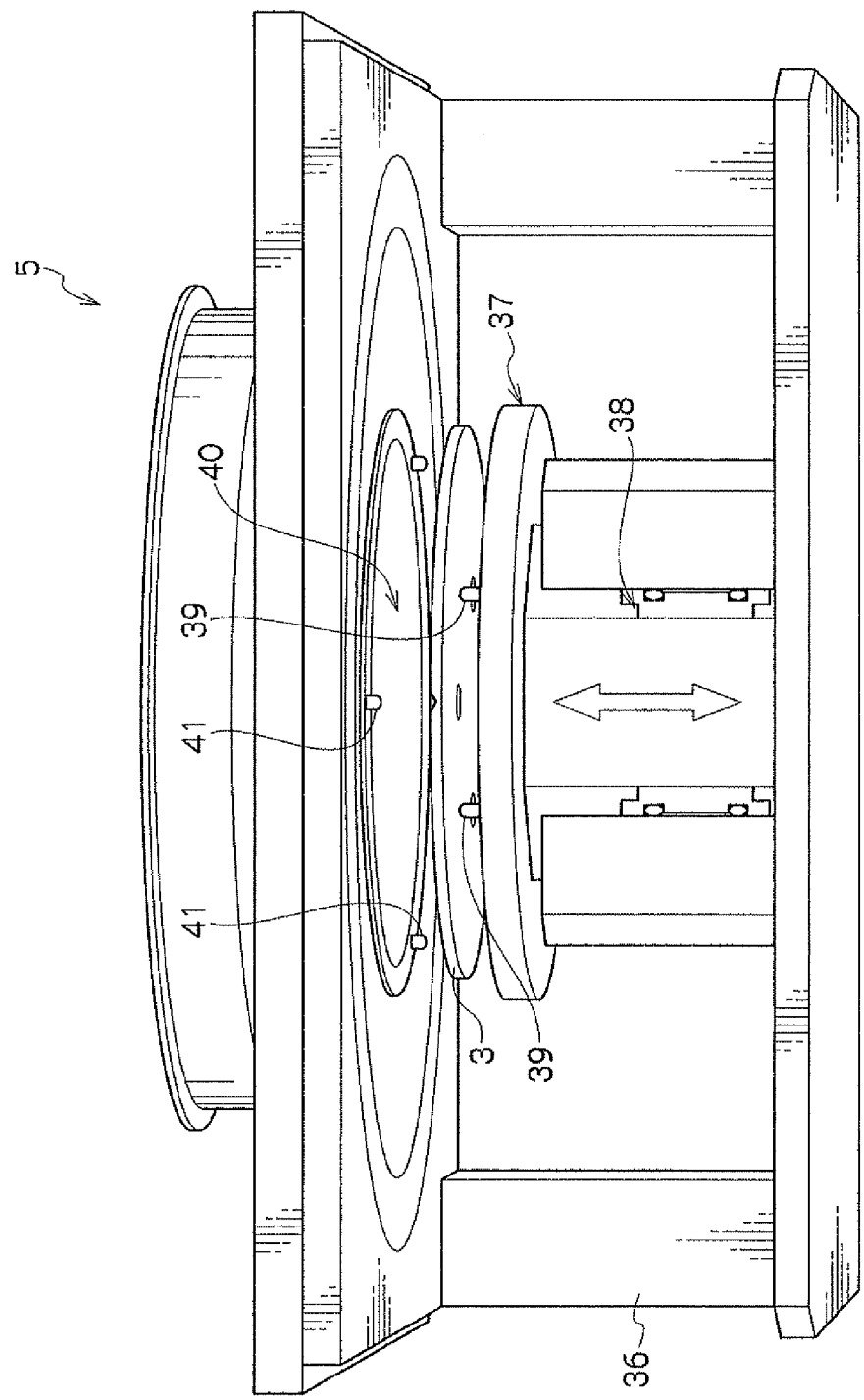
FIG. 7 is a perspective view illustrating a contact unit of the wafer prober for semiconductor inspection according to the embodiment of the present invention.
Figure 8:
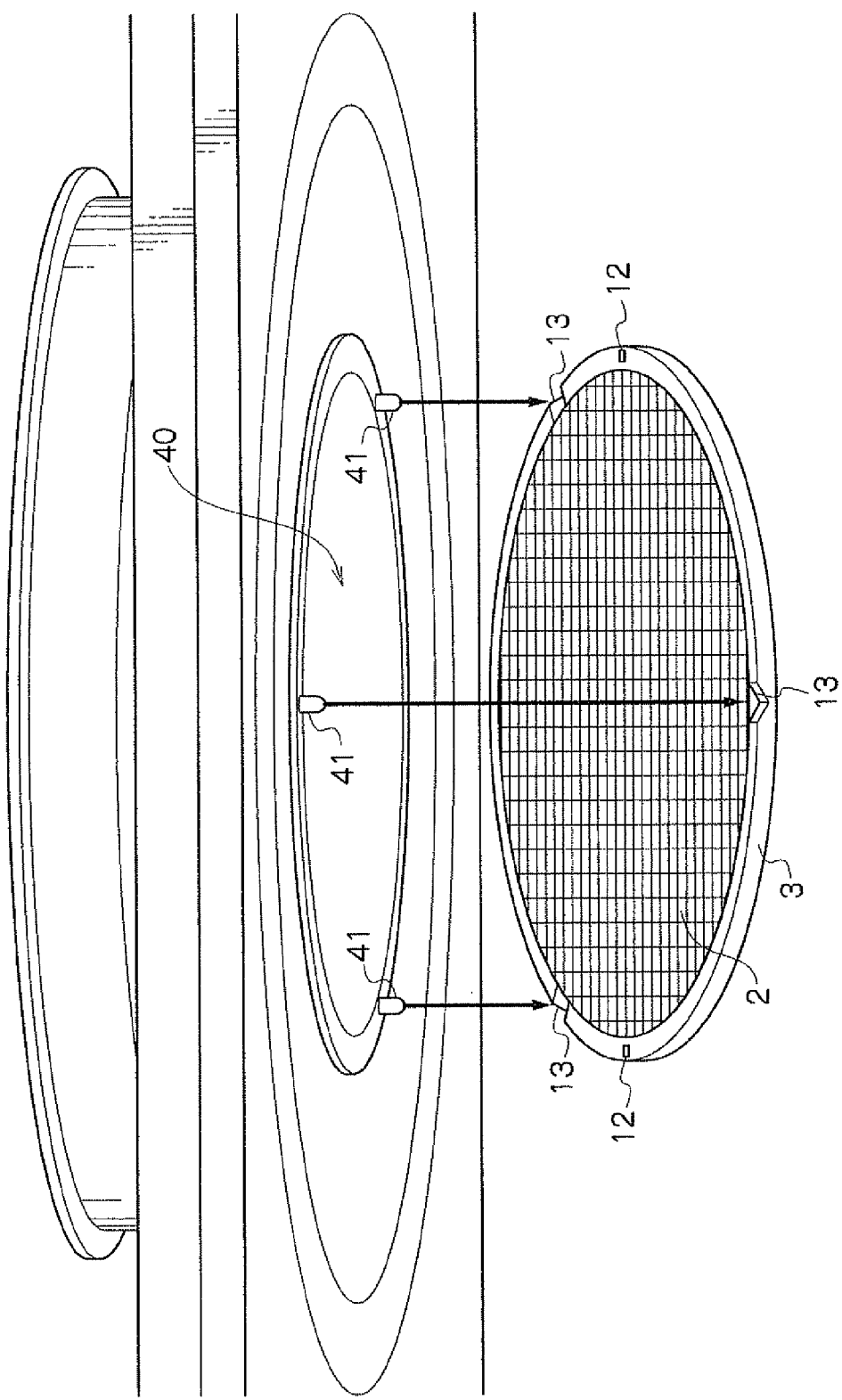
FIG. 8 is a perspective view illustrating an essential part of the contact unit of the wafer prober for semiconductor inspection according to the embodiment of the present invention.

Each contact unit 5 mainly includes, as shown in FIGS. 7 and 8, a frame 36, a tray chuck 37, a Z-axis stage 38, a delivery pin 39, the probe card 40, a positioning pin 41, and an air pump (not shown). The positioning pin 41 constitutes tray positioning means for positioning the tray 3 with respect to the contact unit 5 (the wafer 2 with respect to the probe card 40).

The frame 36 is a framework constituting the entirety. On this frame 36, the tray chuck 37, the probe card 40 and the like are mounted.

The tray chuck 37 is a placement table on which the tray 3 is placed. The tray chuck 37 is formed in a disk shape slightly larger than the tray 3. The tray chuck 37 is supported by the Z-axis stage 38. As a result, the tray chuck 37 is moved in the Z-axis direction (vertical direction) by the Z-axis stage 38.

Figure 9:
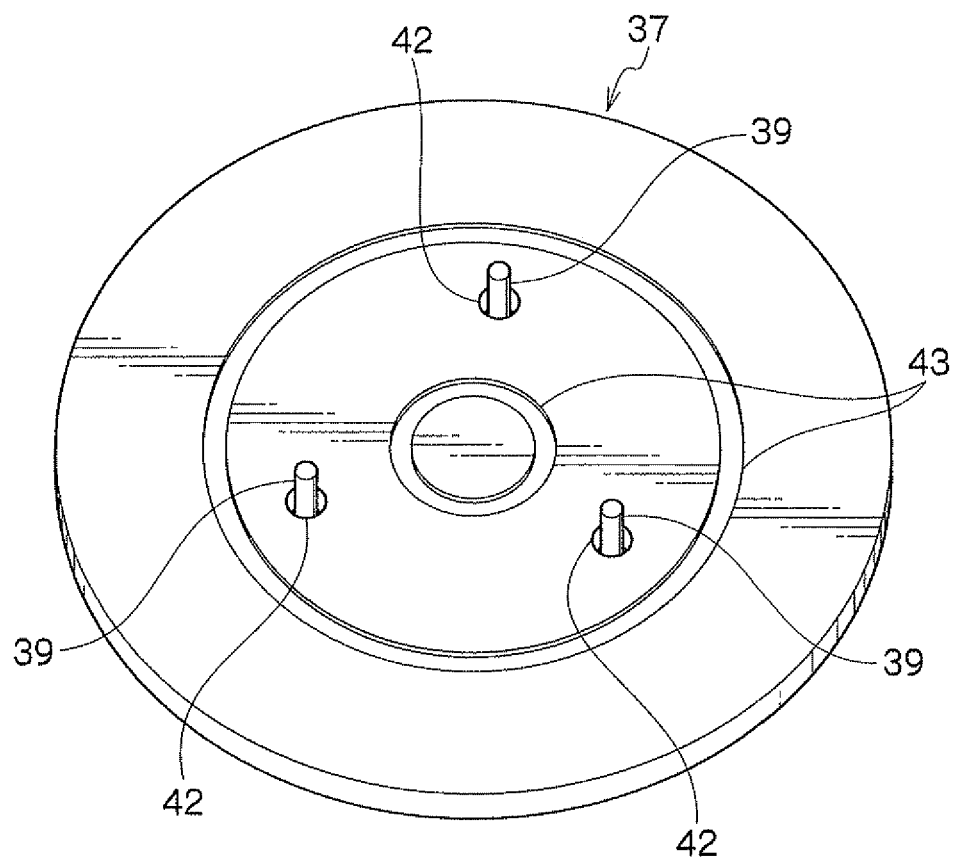
FIG. 9 is a perspective view illustrating a tray chuck of the contact unit according to the embodiment of the present invention.

In the tray chuck 37, a pin hole 42 and a suction floating groove 43 are disposed as shown in FIG. 9. The pin hole 42 is a hole through which the delivery pin 39 is relatively inserted back and forth. The pin holes 42 are disposed at the apex positions of a regular triangle similar to the pin hole 11 of the tray 3.

The suction floating groove 43 includes two annular grooves formed concentrically on the upper side face of the tray chuck 37. A communication hole (not shown) is disposed in a bottom part of the suction floating groove 43, and the communication hole is connected to the air pump. As a result, if the air pump sucks, the tray 3 placed on the tray chuck 37 is sucked and fixed, and if a gas is injected, the tray 3 placed on the tray chuck 37 is floated so that the tray 3 can be easily displaced.

Figure 10:
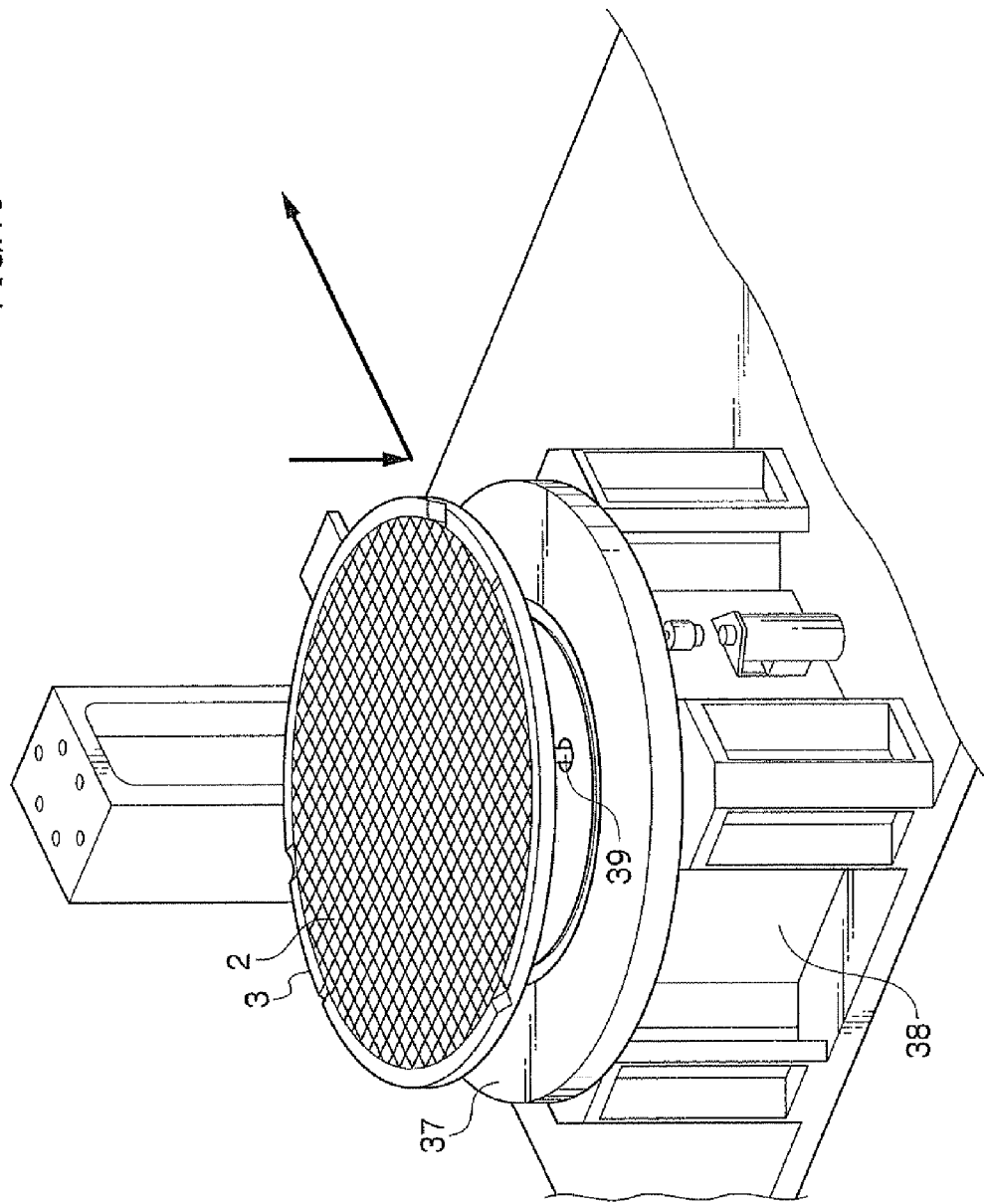
FIG. 10 is a perspective view illustrating an essential part of the contact unit according to the embodiment of the present invention.

The Z-axis stage 38 is a member for supporting the tray chuck 37 and moving it in the Z-axis direction (vertical direction) as shown in FIG. 10. When the tray chuck 37 is moved by the Z-axis stage 38 in the Z-axis direction with respect to the fixed delivery pin 39, the delivery pin 39 goes in and out of the pin hole 42 of the tray chuck 37. As a result, when the tray chuck 37 is lowered, the delivery pin 39 is extended from the tray chuck 37, and the tray 3 is delivered in this state. When the tray chuck 37 is raised, the delivery pin 39 sinks into the tray chuck 37, and the tray 3 supported by the delivery pin 39 is placed on the upper side face of the tray chuck 37.

The delivery pin 39 is fixed on the frame 36 side. As a result, as mentioned above, when the tray chuck 37 is moved by the Z-axis stage 38 in the Z-axis direction, the delivery pin 39 relatively goes in and out of the pin hole 42 of the tray chuck 37. It may be so configured that a Z-axis stage for vertically moving the delivery pin 39 so that the delivery pin 39 goes in and out of the pin hole 42 of the tray chuck 37.

The probe card 40 is a device provided with, as shown in FIGS. 7, 8, 11 and 12, a plurality of probes 40A (See FIG. 20) on its lower side face for conducting inspection by bringing the probes into contact with the circuit of the wafer 2 supported by the tray 3. The probe card 40 is formed substantially in a disk shape, and the plurality of probes are disposed on its lower side, extending downward. The probe cards 40 are disposed in a state supported on the frame 36 side and faced with the tray chuck 37.

Figure 13A:
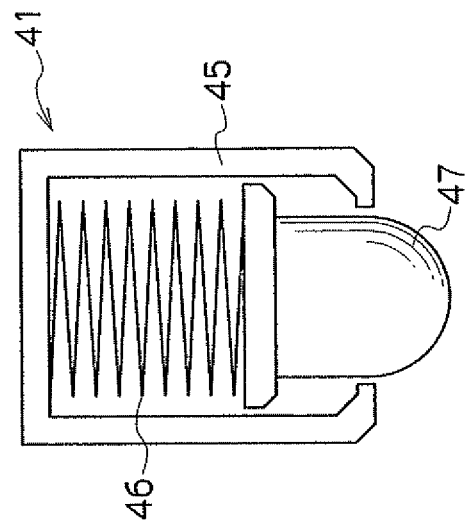
FIG. 13 are sectional views illustrating a positioning pin of the probe card of the contact unit according to the embodiment of the present invention.
Figure 13B:
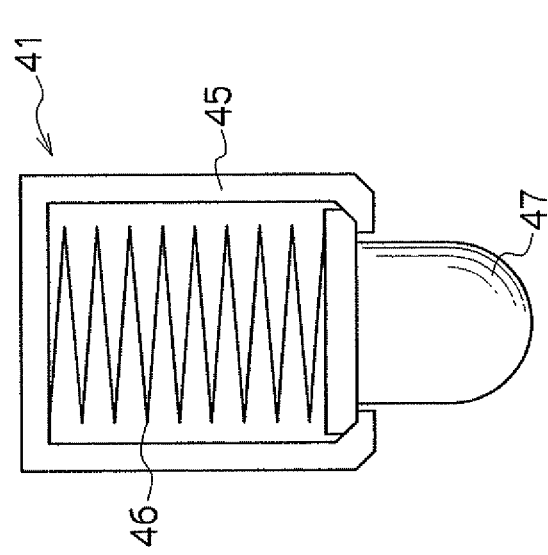

Moreover, on the lower side face of the probe card 40, the positioning pins 41 for positioning the tray 3 by being fitted in the alignment portions 13 of the tray 3 are disposed. Three positioning pins 41 are provided, facing three alignment portions 13 provided on the tray 3, respectively. The positioning pin 41 includes, as shown in FIG. 13, a cylindrical main body cylinder portion 45 having a bottom part, a spring 46 inserted into the main body cylinder portion 45, and a fitting projection 47 mounted on the main body cylinder portion 45 capable of going in and out and urged by the spring 46 in the extending direction. The distal end of the fitting projection 47 is formed spherically so as to slide smoothly. As a result, the tray 3 is configured to be displaced in the XYθ directions till the spherical fitting projection 47 touches and mutually slides on a slope of the V-groove constituting the alignment portions 13 and finally fits into the innermost part of the V-groove.

The air pump is a device for sucking and fixing the tray 3 placed on the tray chuck 37 and generating an air floating phenomenon in the tray 3 by blowing out a gas to between the tray chuck 37 and the tray 3. The air pump is disposed in the vicinity of the contact unit 5 and connected to the communication hole (not shown) of the suction floating groove 43 of the tray chuck 37. As the air pump 37, a known pump provided with a function to suck a gas and a function to protrude can be used.

The tray transport portion 6 is a device for transporting the tray 3 which supports the wafer 2 between the alignment unit 4 and the contact unit 5. As the tray transport portion 6, any known transporting device can be used. All the transporting devices that can transport the tray 3 between the alignment unit 4 and the contact unit 5 can be used.

The wafer cassettes 7 are containers that can contain a plurality of wafers 2 in parallel. The wafer cassette portion 8 is a placement table on which the wafer cassettes 7 are placed. The two each of wafer cassettes 7 are placed upright in parallel on the wafer cassette portion 8 in a state in which the wafers 2 inside are horizontal.

The wafer transport portion 9 is a device for taking out the wafer 2 in the wafer cassettes 7 placed on the wafer cassette portion 8 and transporting it to the alignment unit 4 and returning the wafer 2 after inspection from the alignment unit 4 into the wafer cassettes 7. As the wafer transport portion 9, any known transporting device can be used. All the transporting devices that can transport the tray 3 between the alignment unit 4 and the contact unit 5 can be used.

The control portion 10 is a device for controlling the entire prober 1. Specifically, the control portion controls a series of operations of the inspection method as will be described below.

[Inspection Method for Using the Prober 1]

Figure 2:
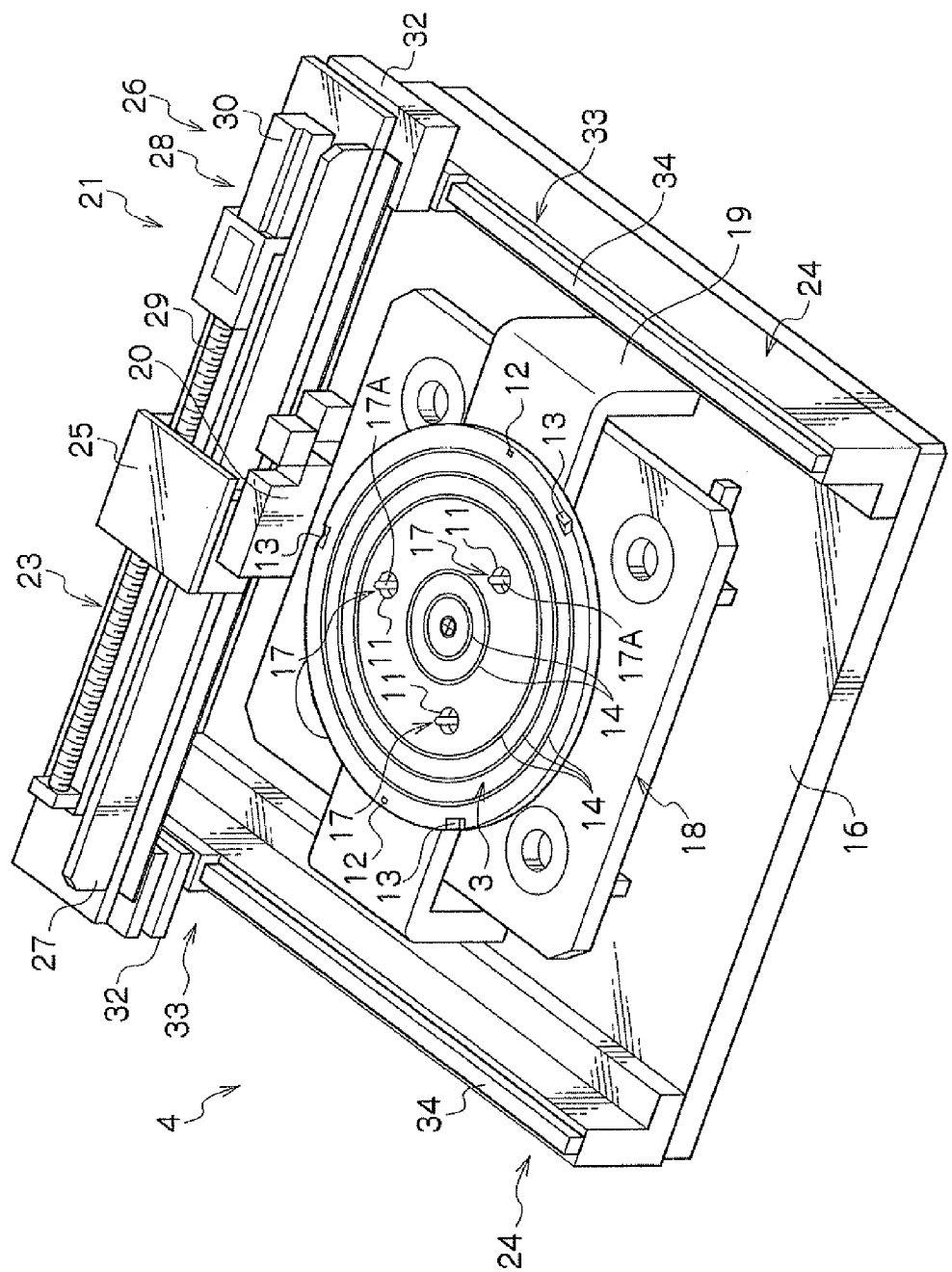
FIG. 2 is a perspective view illustrating an alignment unit of the wafer prober for semiconductor inspection according to the embodiment of the present invention.
Figure 3:
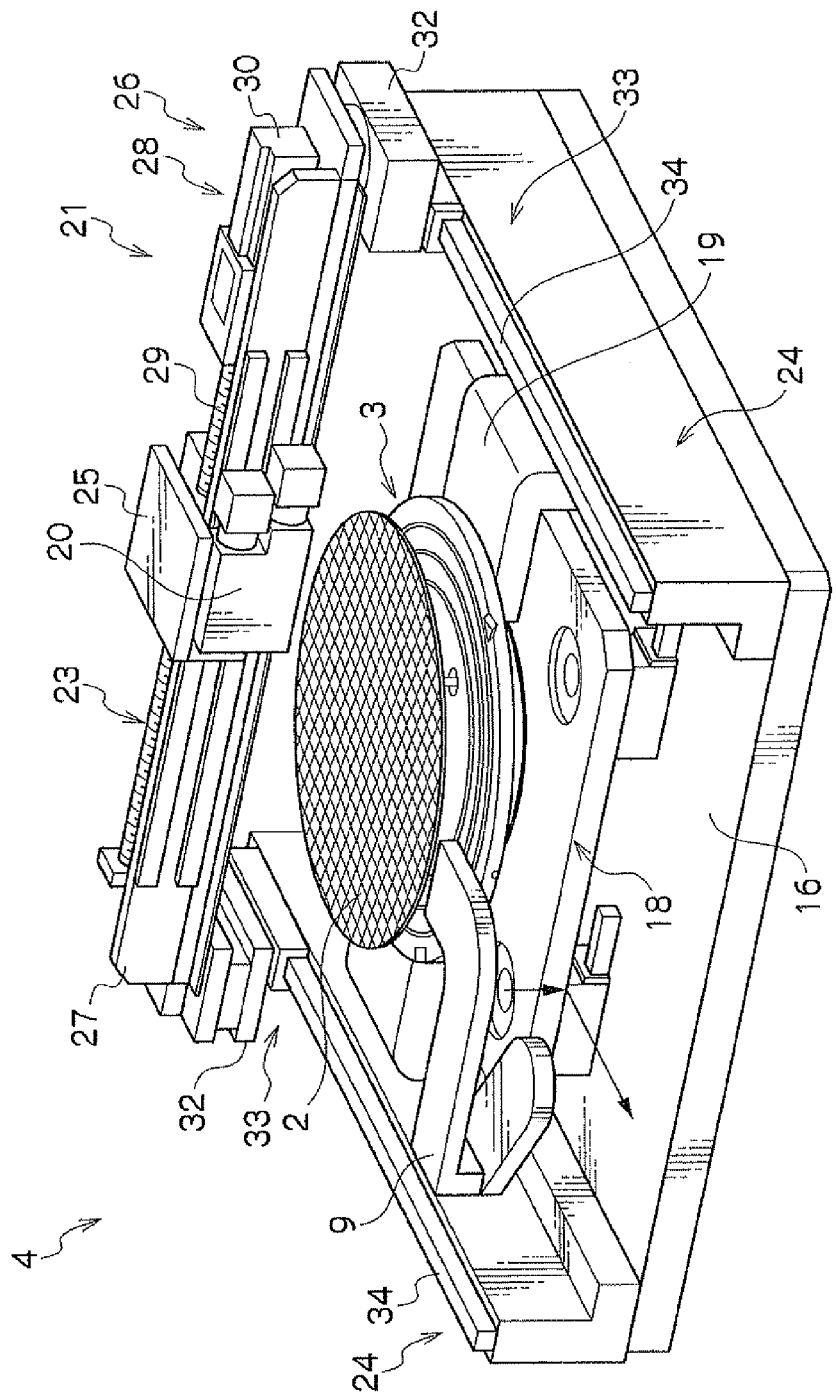
FIG. 3 is a perspective view illustrating the alignment unit of the wafer prober for semiconductor inspection according to the embodiment of the present invention.
Figure 4:
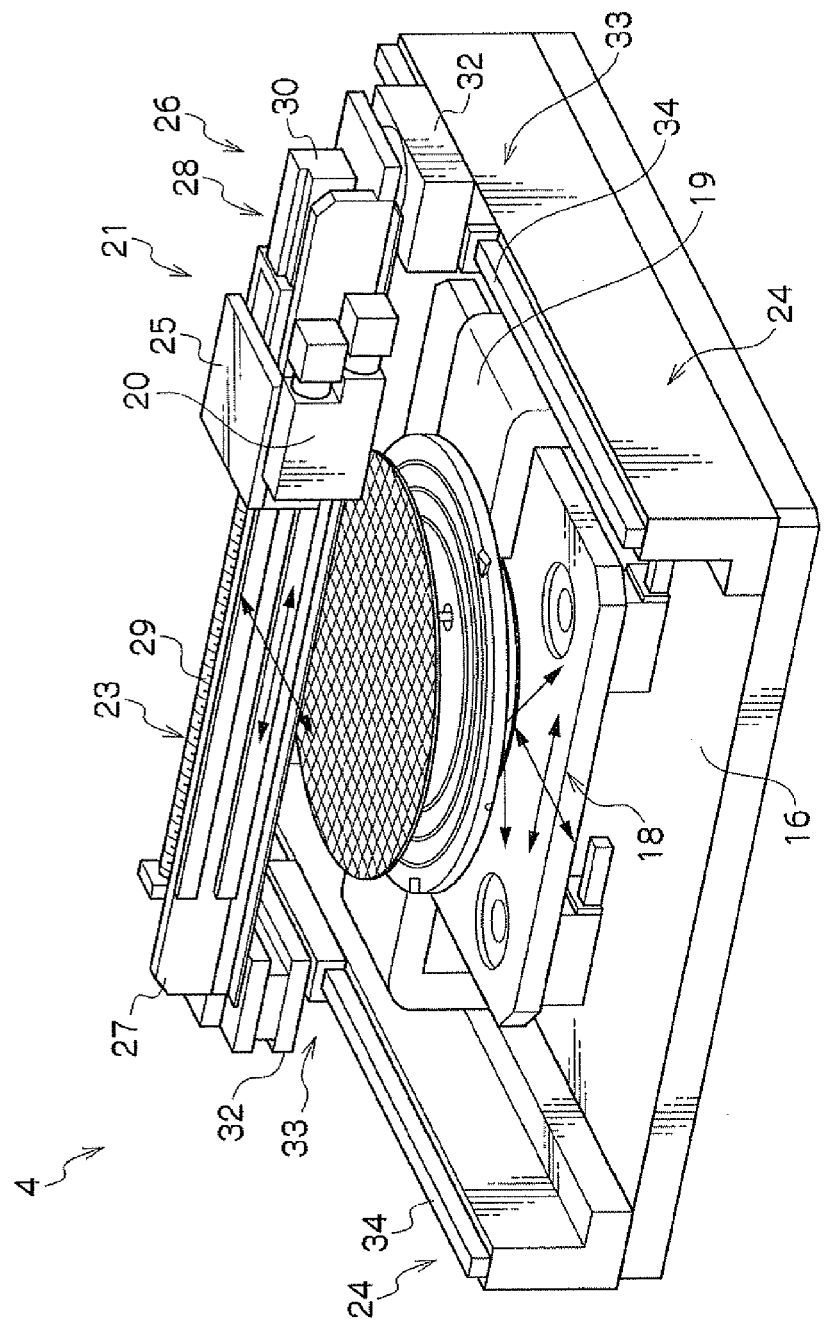
FIG. 4 is a perspective view illustrating the alignment unit of the wafer prober for semiconductor inspection according to the embodiment of the present invention.
Figure 5:
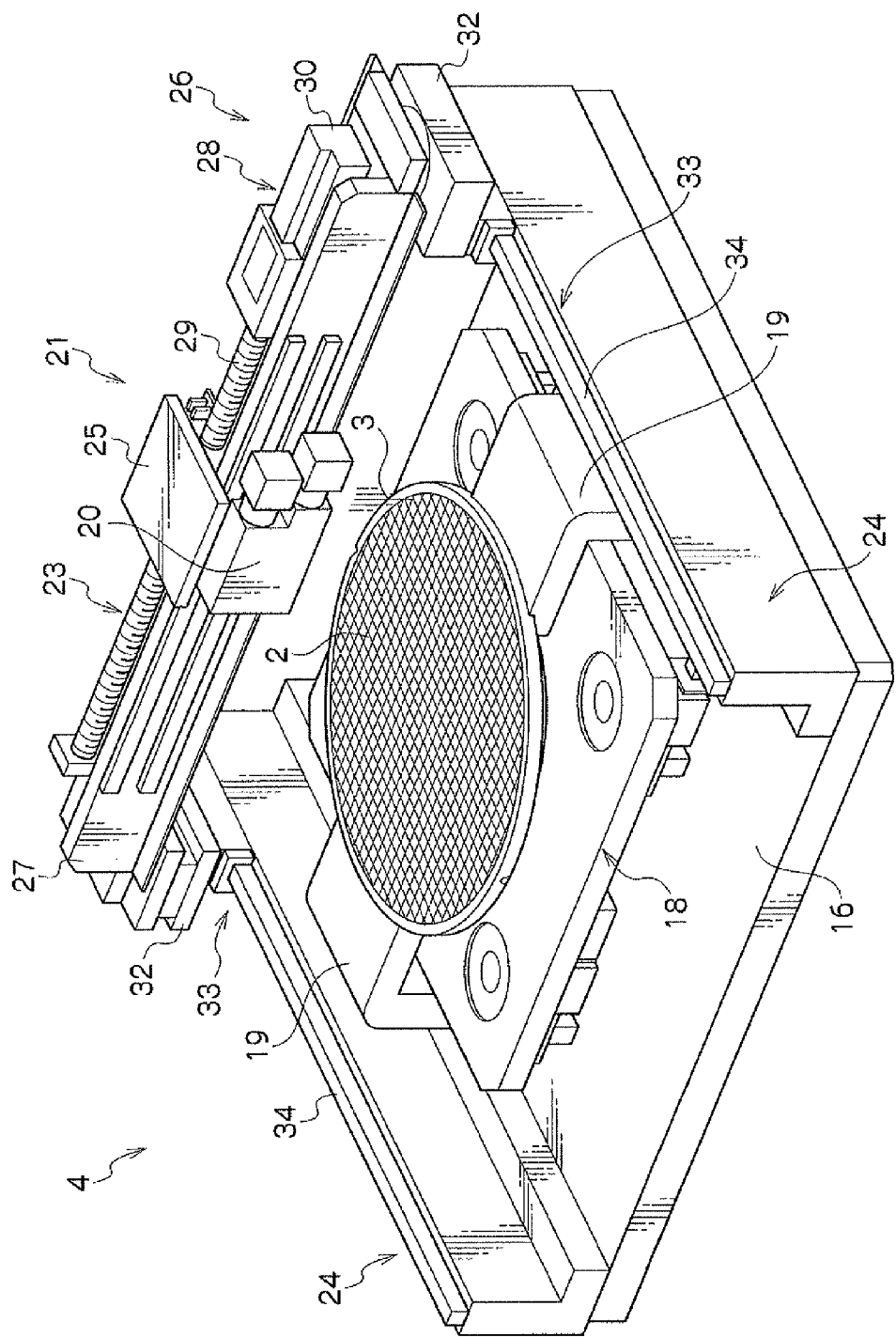
FIG. 5 is a perspective view illustrating the alignment unit of the wafer prober for semiconductor inspection according to the embodiment of the present invention.
Figure 6:
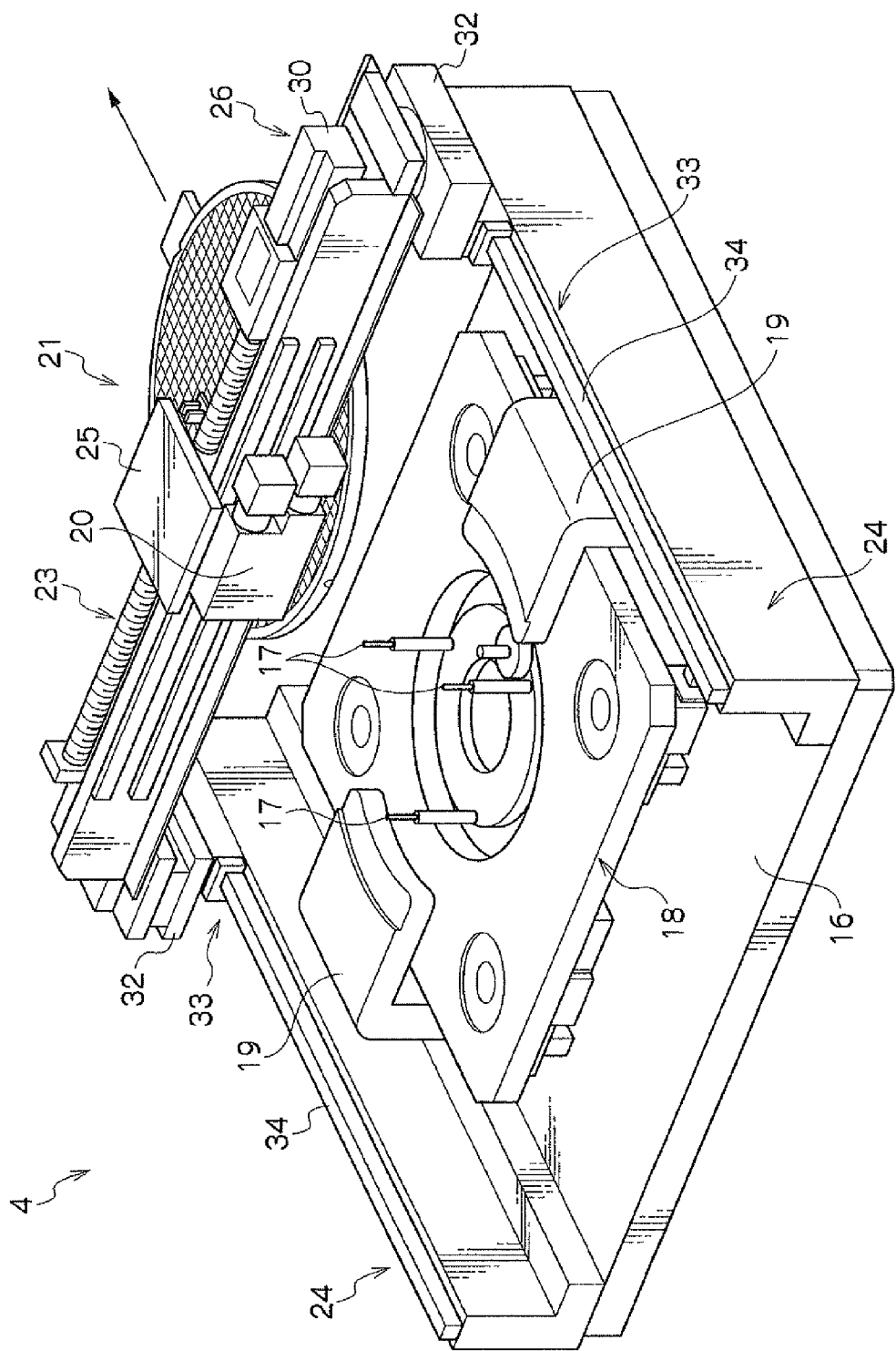
FIG. 6 is a perspective view illustrating the alignment unit of the wafer prober for semiconductor inspection according to the embodiment of the present invention.
Figure 11:
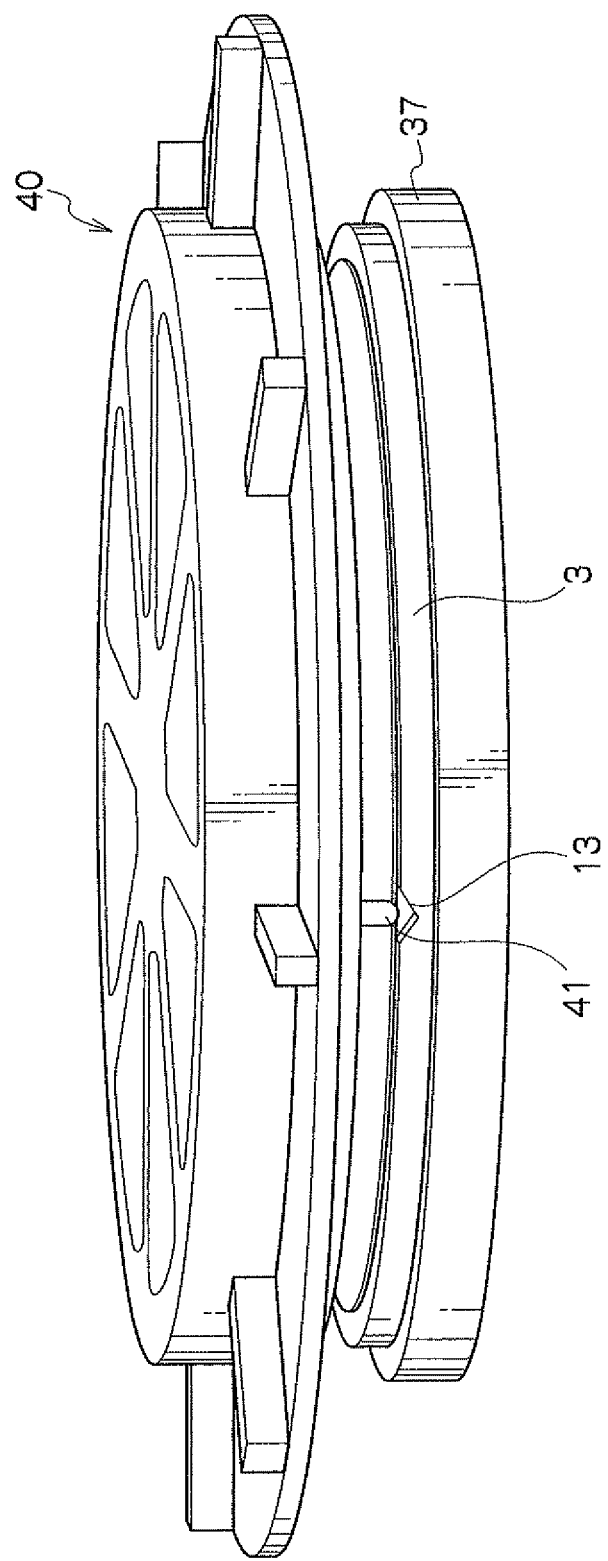
FIG. 11 is a perspective view illustrating a probe card of the contact unit according to the embodiment of the present invention.
Figure 12:
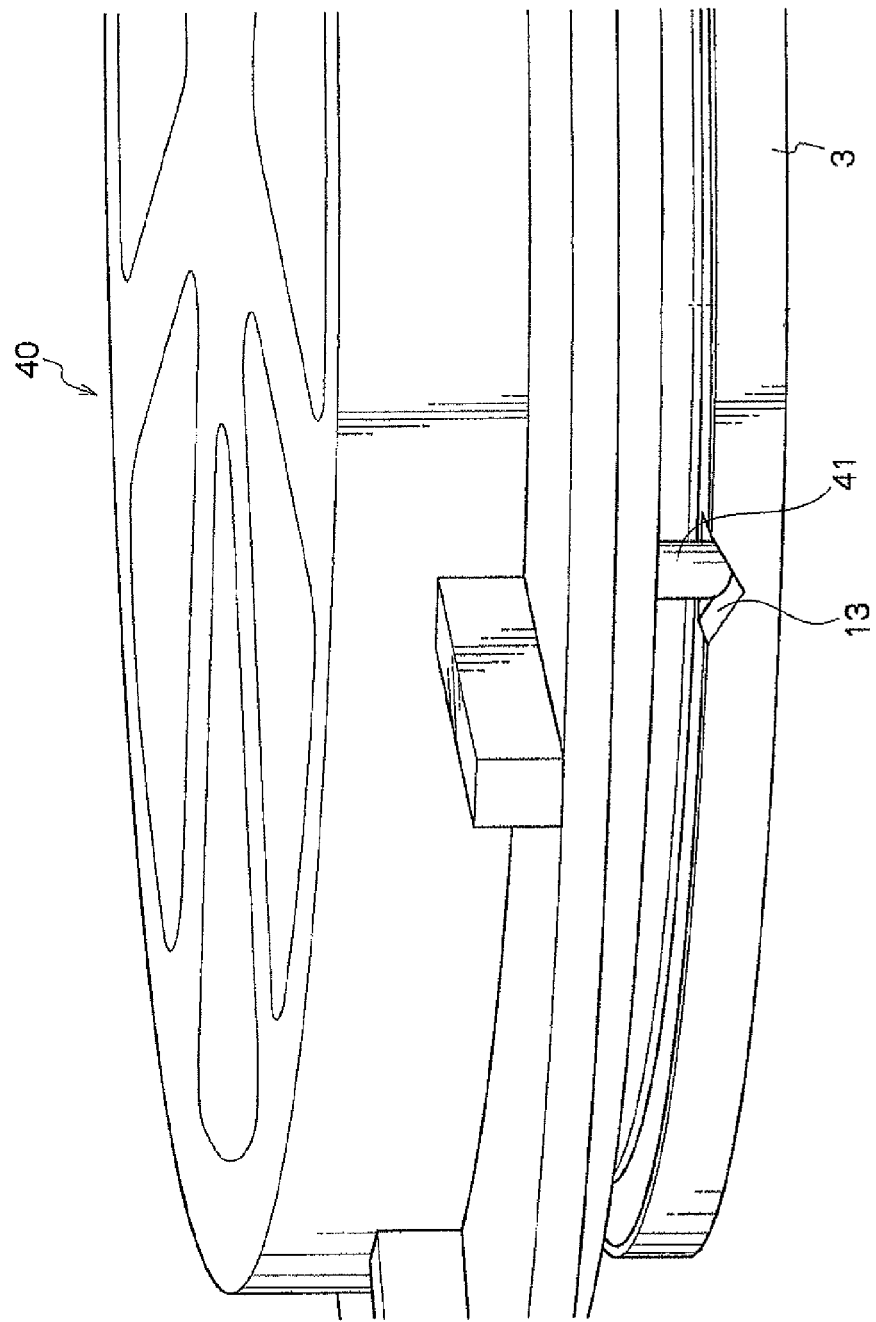
FIG. 12 is a perspective view illustrating an essential part of the probe card of the contact unit according to the embodiment of the present invention.

Subsequently, the inspection method for using the prober 1 having the above configuration will be described on the basis of FIGS. 14 to 22. FIGS. 15 to 22 are outline configuration diagrams illustrating only characteristic mechanisms of the above-mentioned alignment unit 4 and contact unit 5. Also, since FIGS. 2 to 12 describe the inspection method by the prober 1 in order, they will be referred to in the explanation of the following inspection method. FIG. 2 shows, in the alignment unit 4, a state in which the pin portions 17A of the chuck pins 17 are extended from the pin holes 11 of the tray 3. FIG. 3 shows a state in which the wafer 2 is transported by the wafer transport portion 9 to the upper side of the tray 3 installed on the alignment unit 4. FIG. 4 shows a state in which while the marks of the wafer 2 and the tray 3 are photographed by the camera 20, the wafer 2 placed on each of the pin portions 17A of the chuck pins 17 is finely adjusted in the XYθ directions. FIG. 5 shows a state in which the fine adjustment of the wafer 2 has been finished and placed on the tray 3. FIG. 6 shows a state in which the tray 3 placed on the tray holder 19 is being carried out by the tray transport portion 6. FIG. 7 shows a state in which the tray 3 is placed on the delivery pins 39 projected from the tray chuck 37 of the contact unit 5. FIG. 8 shows a state in which the alignment portions 13 of the tray 3 placed on the delivery pins 39 is roughly matched with the positioning pins 41 of the probe card 40. FIG. 9 shows a state in which the delivery pins 39 protrude from the tray chuck 37. FIG. 10 shows a state in which the arm of the tray transport portion 6 places the tray 3 on the delivery pins 39 and is pulled out. FIG. 11 shows a state immediately before the alignment portions 13 of the tray 3 and the positioning pin 41 of the probe card 40 are fitted with each other. FIG. 12 shows a state in which the tray chuck 37 has been raised by the Z-axis stage 38 and the alignment portions 13 of the tray 3 and the positioning pin 41 of the probe card 40 are fitted with each other. This series of flow will be described mainly referring to FIGS. 15 to 22.

This inspection method includes a first process for positioning the wafer 2 at the set position with respect to the tray 3 by the alignment unit 4, a second process for selectively transporting the tray 3 which supports the wafer 2 by the tray transport portion 6 to the contact units 5 arranged in number larger than that of the alignment units 4, a third process for positioning the tray 3 which supports the wafer 2 with respect to the contact unit 5, and a fourth process for conducting inspection of the plurality of wafers 2 in parallel by bringing the probe needle 40A into contact with the electrode of the wafer 2, respectively, by the plurality of contact units 5. In the first process, the wafer 2 is taken out of each wafer cassette 7 placed on the wafer cassette portion 8 by the wafer transport portion 9 and placed on each of the alignment units 4.

Figure 15:
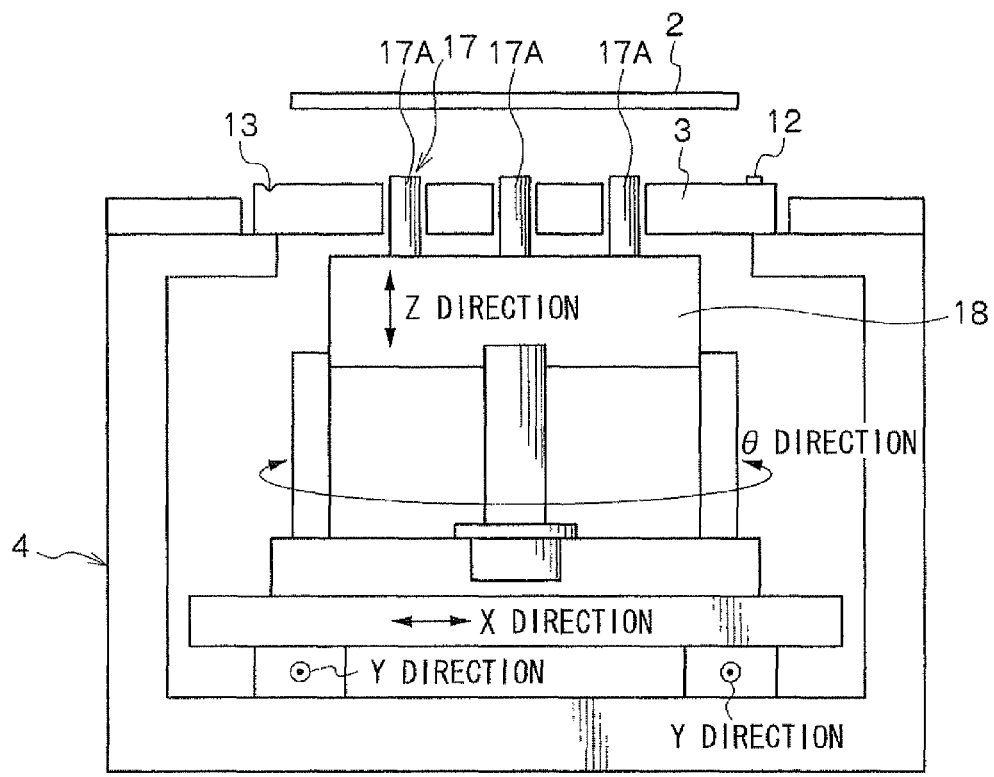
FIG. 15 is a sectional view illustrating a state in which a wafer has been moved onto the tray of the alignment unit according to the embodiment of the present invention.
Figure 16:
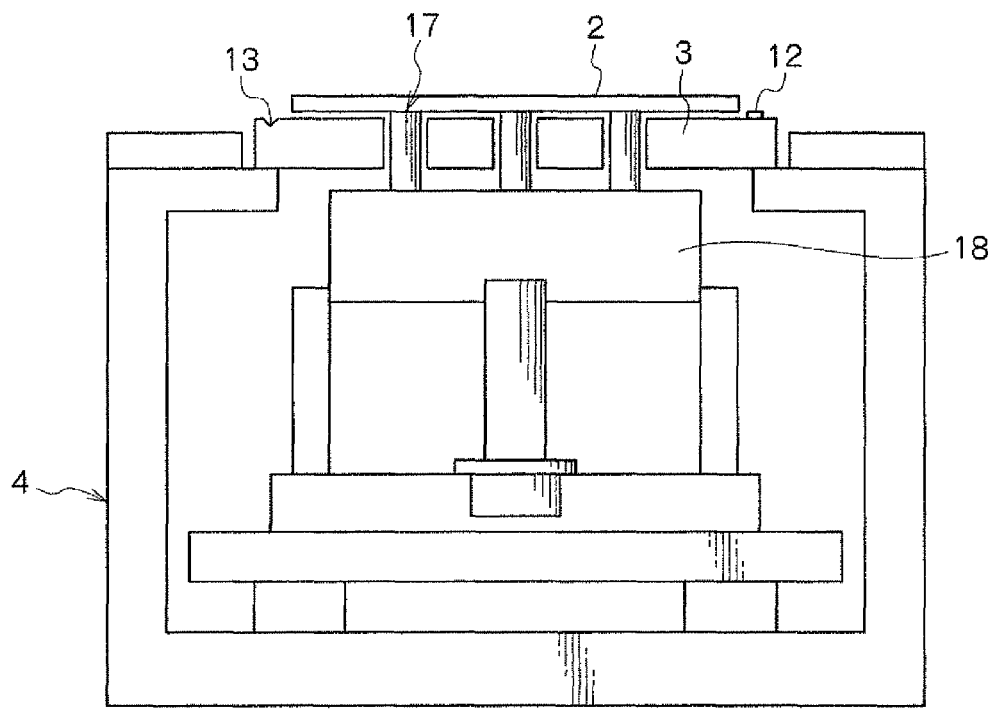
FIG. 16 is a sectional view illustrating a state in which the wafer is placed on the tray of the alignment unit according to the embodiment of the present invention.

In the alignment unit 4, as shown in FIG. 15, the chuck pins 17 extend from the pin holes 11 on the tray 3. The wafer 2 is, as shown in FIG. 16, placed on the chuck pins 17. The chuck pins 17 are supported by the XYZθ stage 18. The XYZθ stage 18 positions the wafer 2 at the set position with respect to the tray 3 by moving the wafer 2 in the XYZθ directions through the chuck pins 17.

Figure 17:
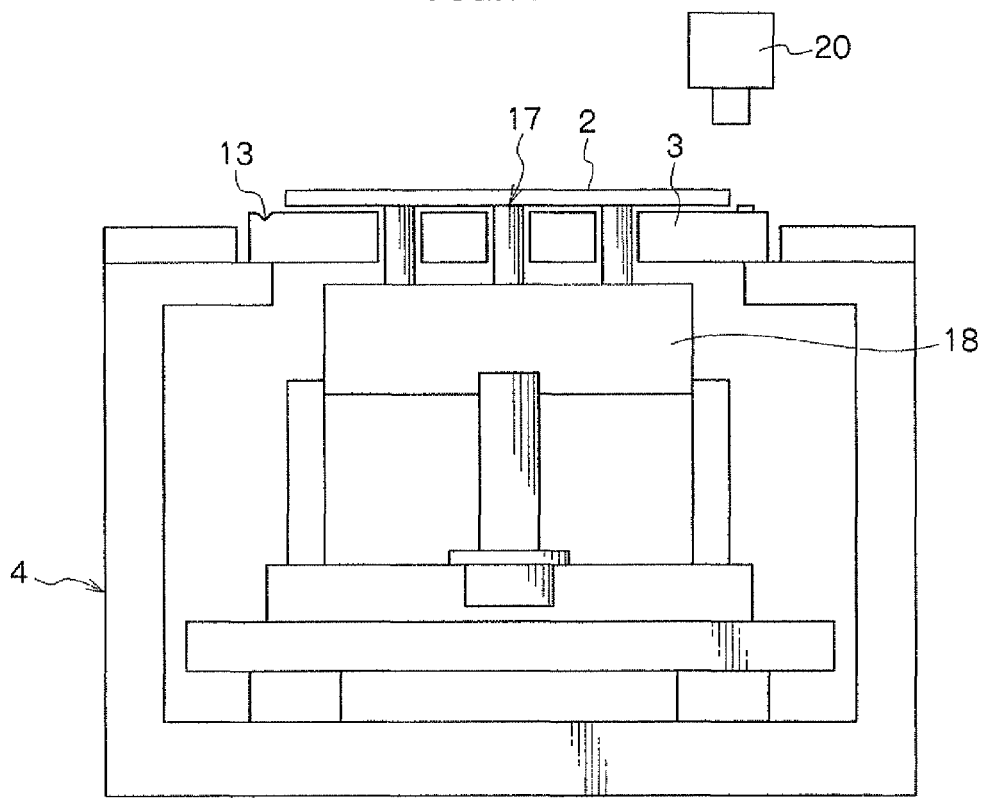
FIG. 17 is a sectional view illustrating a state in which the wafer on the tray of the alignment unit according to the embodiment of the present invention is positioned using a camera.

The X-axis moving mechanism 23 and the Y-axis moving mechanism 24 of the camera driving portion 21 support and move the camera 20 in the X-axis direction and the Y-axis direction and as shown in FIG. 17, are moved to predetermined positions on the upper side of the wafer 2 and the tray 3. The camera 20 photographs the mark or the like of the wafer 2 (a specific chip formed on the wafer 2 or its electrode pad, for example) and the alignment marks 12 of the tray 3 at the same time. An image of the camera 20 is inputted to the control portion 10 and applied with image processing.

Then, by means of the processing by the control portion 10, the wafer 2 is moved by the XYZθ stage 18 so that displacement between the mark or the like of the wafer 2 and the alignment mark 12 of the tray 3 is absorbed.

Figure 18:
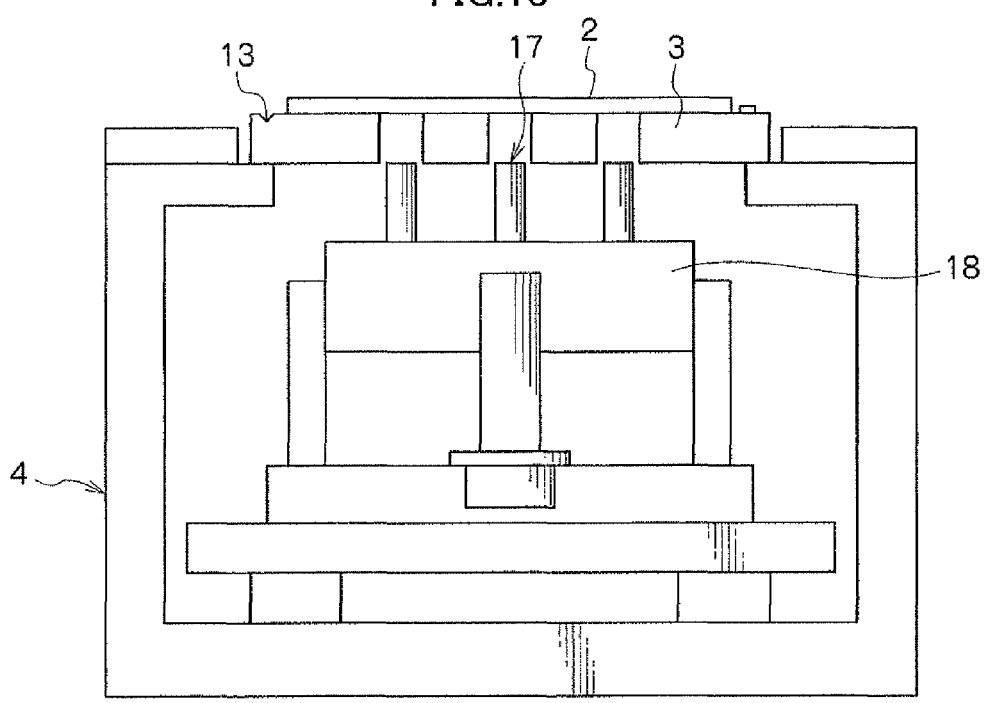
FIG. 18 is a sectional view illustrating a state in which a chuck pin is lowered after the wafer of the alignment unit has been positioned according to the embodiment of the present invention.

Subsequently, when the mark or the like of the wafer 2 and the alignment marks 12 of the tray 3 are matched with each other and the wafer 2 is positioned at the installation position of the tray 3, the chuck pins 17 are lowered by the XYZθ stage 18 as shown in FIG. 18 and the wafer 2 is placed on the tray 3.

On the other hand, the tray 3 placed on the alignment unit 4 has the vacuum chamber inside communicate with the vacuum pump, and when the wafer 2 is placed on the upper side face of the tray 3, the vacuum pump is operated so as to vacuum the vacuum chamber, and the wafer 2 is sucked by the suction grooves 14 and fixed to the tray 3.

Figure 19:
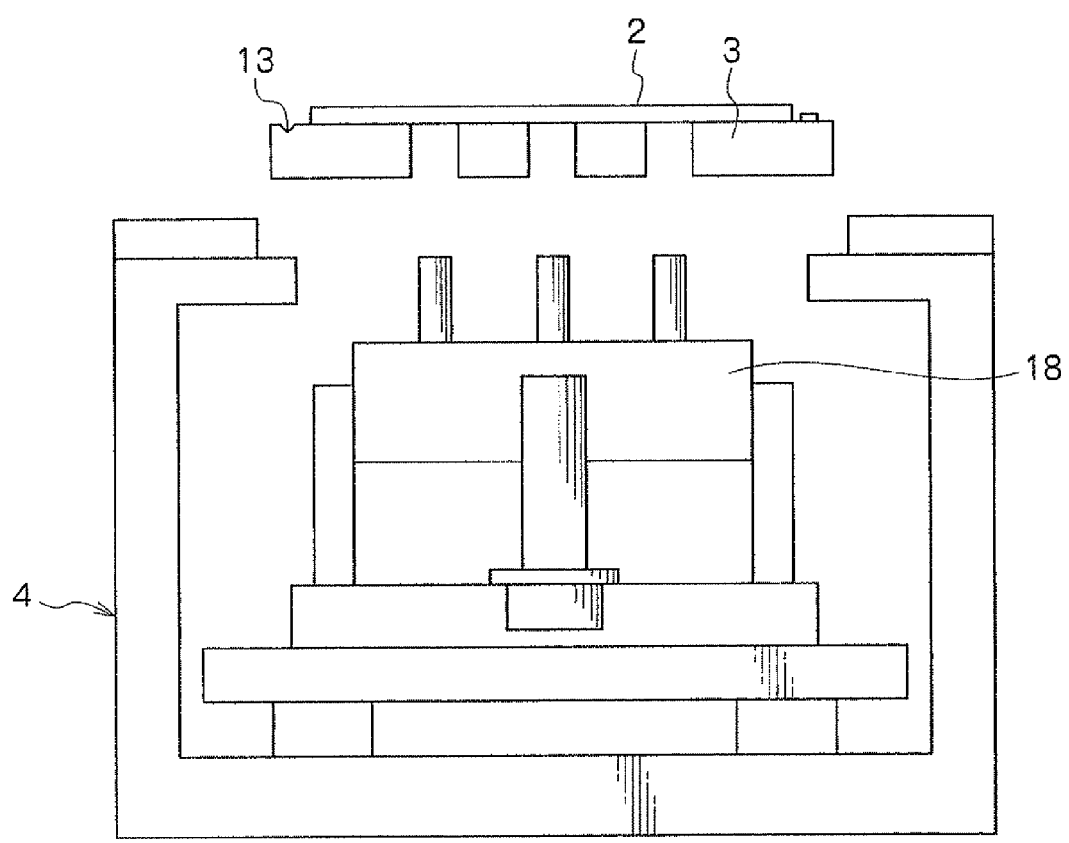
FIG. 19 is a sectional view illustrating a state in which the tray has been carried out of the alignment unit according to the embodiment of the present invention.

In the second process, the tray 3 which supports the wafer 2 is lifted by the tray transport portion 6 as shown in FIG. 19 and selectively transported to the contact unit 5. At this time, when the tray transport portion 6 lifts the tray 3 from the alignment unit 4, the vacuum chamber in the tray 3 is sealed by the check valve, and the wafer 2 is reliably fixed to the tray 3. In this state, the tray 3 is transported by the tray transport portion 6 to the contact unit 5.

In the third process, the tray 3 which supports the wafer 2 is positioned with respect to the contact unit 5. The tray 3 transported by the tray transport portion 6 to the contact unit 5 is placed in a state in which it is roughly positioned by the delivery pins 39.

Figure 20:
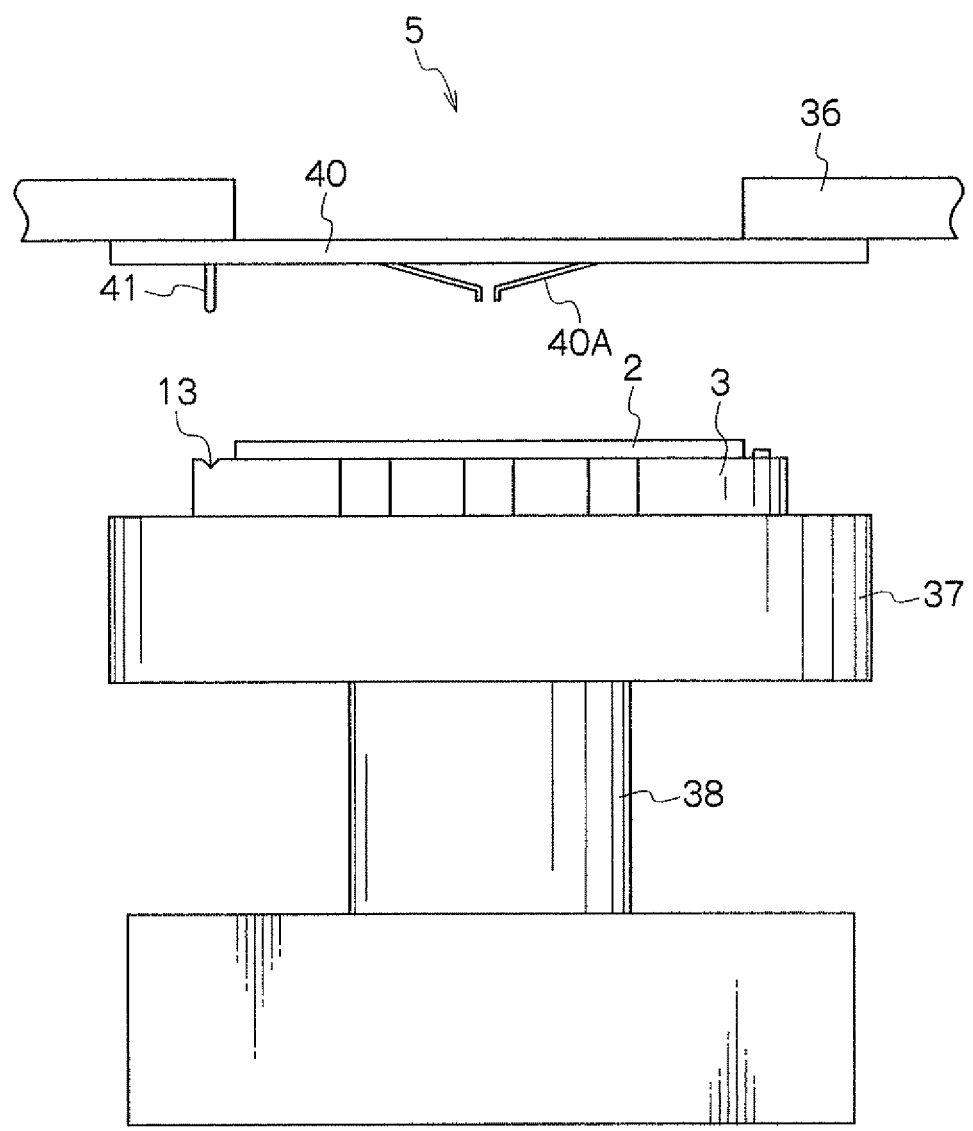
FIG. 20 is a sectional view illustrating a state in which the tray is placed on the tray chuck of the contact unit according to the embodiment of the present invention.
Figure 21:
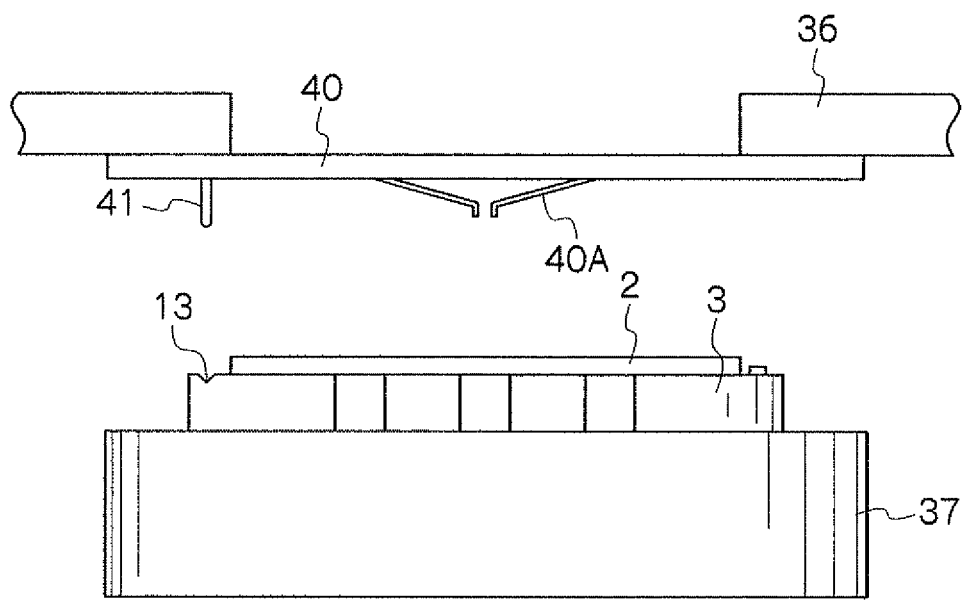
FIG. 21 is a sectional view illustrating a state in which the probe card is faced with the tray placed on the tray chuck according to the embodiment of the present invention.
Figure 22:
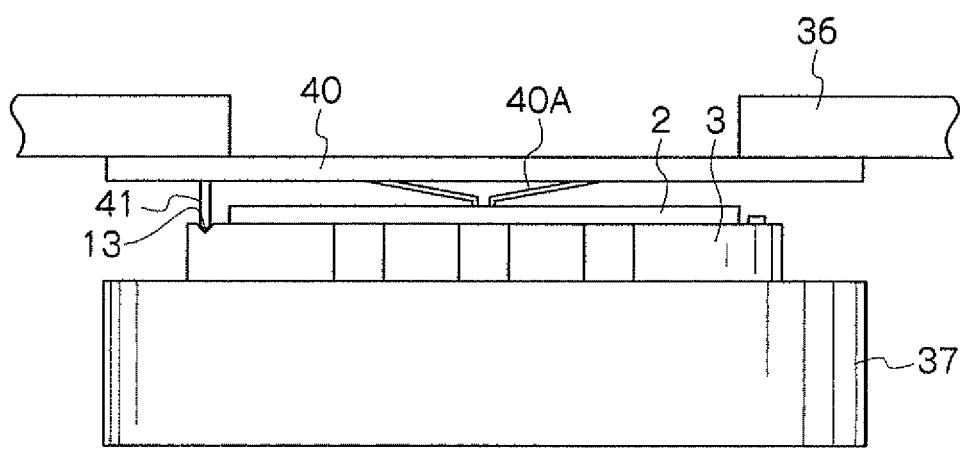
FIG. 22 is a sectional view illustrating a state in which the positioning pin of the probe card is fitted with the alignment portion of the tray placed on the tray chuck according to the embodiment of the present invention.

Then, the tray chuck 37 is raised by the Z-axis state 38 and the delivery pins 39 relatively sink into the pin holes 42. As a result, as shown in FIG. 20, the tray 3 is placed on the upper side face of the tray chuck 37. Then, the air pump is operated, and the tray 3 placed on the tray chuck 37 is sucked by the suction floating groove 43 and fixed. Moreover, when the tray chuck 37 is raised by the Z-axis stage 38, each alignment portion 13 of the tray 3 is fitted in the positioning pin 41 of the probe card 40 from the state in FIG. 21 to FIG. 22.

At this time, the air pump is switched, gas is blown out of the suction floating groove 43 of the tray chuck 37, and the air floating phenomenon is generated in the tray 3. As a result, the tray 3 is brought into a state in which it can move freely and smoothly on the upper side face of the tray chuck 37.

Figure 14C:
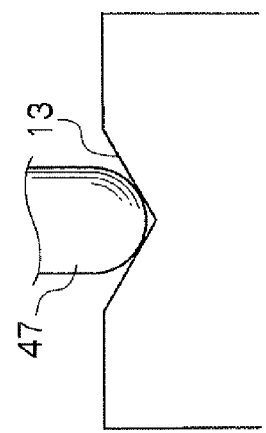
FIG. 14 are sectional views illustrating a fitted state between a fitting projection of the probe card and an alignment portion of the tray according to the embodiment of the present invention.
Figure 14B:
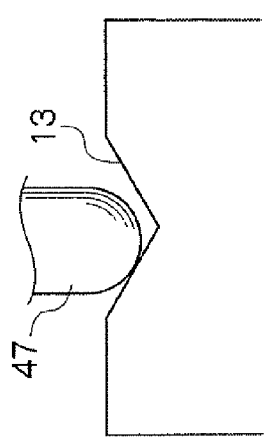
Figure 14A:
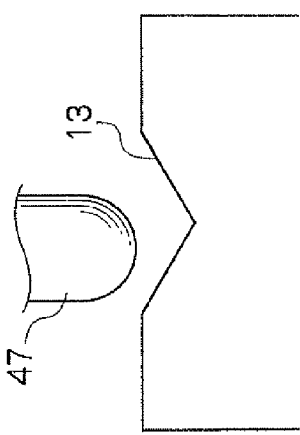

In this state, the tray chuck 37 is further raised by the Z-axis stage 38, and the distal end of the spherical fitting projection 47 is fitted in the V-groove of the alignment portion 13 from the state in FIG. 14A to FIG. 14B. Then, as shown in FIG. 14C, the distal end of the spherical fitting projection 47 is fitted into the innermost part of the V-groove. Then, when the distal end of the fitting projection 47 is fitted into the innermost part of the V-groove, the distal end of the fitting projection 47 touches and mutually slides on the slope of the V-groove constituting the alignment portion 13, and the tray 3 slides to a predetermined position. Since three V-grooves of the alignment portion 13 are disposed with the orientations of the grooves displaced by 120 degrees each, when the three positioning pins 41 are fitted, respectively, the tray 3 is positioned at three positions displaced by 120 degrees each. As a result, the tray 3 is positioned with respect to the contact unit 5, and the wafer 2 placed at the set position on the tray 3 is positioned with respect to the probe card 40 of the contact unit 5.

The above-mentioned first to third processes are sequentially carried out as the tray 3 is transported to all the contact units 5.

In the fourth process, at each contact unit 5, each probe of the probe card 40 is brought into contact with the wafer 2, and inspection is conducted in parallel. In the third process, in a state in which the wafer 2 is positioned with respect to the probe card 40, the tray 3 on the tray chuck 37 is further raised by the Z-axis state 38, and from the state in FIG. 13A to FIG. 13B, while the fitting projection 47 of the positioning pin 41 is pushed into the main body cylinder portion 45, each probe of the probe card 40 is brought into contact with the wafer 2 and an inspection signal is applied.

When the inspection is finished, the tray is returned by the tray transport portion 6 to the alignment unit 4 and returned by the wafer transport portion 9 to the wafer cassette portion 8.

Then, till all the wafers 2 in the wafer cassettes 7 have been inspected, the first to fourth processes are repeated.

[Advantages]

The alignment unit 4 is a device for performing alignment of the wafer 2, and a work time for alignment for the single wafer 2 is shorter than the work time for bringing the probe into contact with the wafer 2 at the contact unit 5 for inspection. Thus, by installing the contact units 5 in the number obtained by dividing contact time (time required for contact and inspection of the wafer 2 by contact unit 5) by alignment time (time required for aligning the wafers 2 by the alignment unit 4) for the single alignment unit 4, time during which the alignment unit 4 or the contact unit 5 is not working is reduced, and an operation rate can be improved.

Since the alignment of the wafer 2 with respect to the tray 3 is finished in advance so that the alignment work of the wafer 2 is omitted in inspection work and the inspection can be conducted by positioning the tray 3 at the contact unit 5 with a positioning mechanism having a simple structure, a large number of wafers 2 can be efficiently inspected, and efficient inspection work can be realized.

With the current device, approximately 1 minute is required for the alignment work and approximately 20 minutes for the inspection work. And thus, with the probe provided with the single alignment unit 4 and the single contact unit 5, the time during which the alignment unit 4 is not working is extremely longer than the working time. On the other hand, by adjusting a movable range of the tray transport portion 6 according to the numbers of the alignment units 4 and the contact units 5, the alignment units 4 and the contact units 5 can be installed in the arbitrary numbers without limitation. Thus, by installing a plurality of contact units 5 for the single or plurality of alignment units 4, the non-working time of the alignment unit 4 can be reduced, and efficient work can be realized.

Also, since the wafer 2 is positioned and fixed to the tray 3 provided with the alignment marks 12 and the alignment portions 13 and positioning and contact are made by using the alignment portions 13 provided in the tray 3 and the positioning pin 41 of the probe card 40, an alignment camera or an alignment stage is no longer needed in the contact unit 5, and an inexpensive and space-saving system can be constructed.

Since the alignment unit 4 and the contact unit 5 are both expensive and bulky components, if the number of the alignment units 4 can be reduced according to the work time, a manufacturing cost of the prober, the size and space can be reduced.

[Variation]

In the above embodiment, two alignment units 4 and four contact units 5 are provided, but the numbers may be changed as appropriate according to required processing capacity. For example, one or three or more alignment units 4 and two, three or five or more contact units 5 may be provided.

In the above embodiment, the chuck pin is supported by the XYZθ stage movably in the XYZθ directions, but it may be supported movably in the XYZθ directions by supporting the tray by the XYZθ stage. In this case, the wafer is supported by the non-moving chuck pin and positioned by the tray moved by the XYZθ stage in the XYZθ directions.

In the above embodiment, each alignment portion 13 is configured by the V-groove but may be configured by a positioning hole. In this case, an opening (inlet and outlet) of the positioning hole is preferably tapered so that the positioning pin 41 can fit with it easily. Alternatively, the alignment portion 13 such as the V-groove and the positioning pin 41 may be provided vice versa. That is, the positioning pin 41 may be provided on the tray 3.

The prober and the inspection method for using the prober of the present invention can be used in all the devices required to efficiently inspect a plurality of the wafers 2.

Reference Signs List

The invention claimed is:

1. A wafer prober for semiconductor inspection comprising:
   a tray which supports a wafer at a set position and transports the wafer to a processing position of the wafer and is installed at the processing position;
   one or more alignment units which position said wafer at said set position with respect to the tray;
   contact units arranged in number larger than that of the alignment units and performing inspection processing in contact with said wafer at said processing position; and
   a tray transport portion which transports said tray supporting said wafer between said alignment unit and said contact unit, said tray having at least three holes therethrough with inner diameters larger than an outer diameter of chuck pins for position adjustment of said wafer by insertion of a chuck pin into each of holes, the holes allowing movement of the chuck pins in the X, Y, Z, and θ directions, an alignment mark disposed on an upper side face of said tray for positioning said wafer, and an alignment portion disposed on the upper side face of said tray for positioning said tray itself.

2. The wafer prober for semiconductor inspection according to claim 1, wherein
   said tray is provided with a vacuum chamber inside for securing said wafer placed on the tray by vacuum.

3. The wafer prober for semiconductor inspection according to claim 2, wherein
   said alignment unit is provided with a vacuum pump for evacuating the vacuum chamber of said tray.

4. The wafer prober for semiconductor inspection according to claim 2, wherein
   said alignment unit is provided with a tray holder on which said tray is placed, a chuck pin inserted through the pin hole of said tray, supporting said wafer from below, and moving the same in the X, Y, Z, and θ directions so as to make positional adjustment of said wafer, an XYZθ stage for supporting and moving the chuck pin in the X, Y, Z, and θ directions, a camera for photographing said wafer supported by said chuck pin and the alignment mark on said tray for positioning said wafer with respect to said tray, and a camera driving portion for moving the camera to a predetermined position.

5. The wafer prober for semiconductor inspection according to claim 2, wherein
   said contact unit is provided with a placement table on which said tray is placed, a probe card provided above the placement table, facing the placement table, for conducting inspection by bringing the probe into contact with the wafer supported by said tray, an air pump for forming a vacuum to fix said tray placed on said placement table and for blowing gas between said placement table and said tray for generating an air floating phenomenon, and a positioning pin provided on said probe card, facing an alignment portion of said tray, for positioning said tray by fitting with the alignment portion.

6. The wafer prober for semiconductor inspection according to claim 5 wherein the alignment portion is a V-groove.

7. The wafer prober for semiconductor inspection according to claim 1, wherein
said alignment unit is provided with a tray holder on which said tray is placed, a chuck pin inserted through the pin hole of said tray, supporting said wafer from below, and moving said wafer in the X, Y, Z, and θ directions so as to make positional adjustment of said wafer, an XYZθ stage for supporting and moving the chuck pin in the X, Y, Z, and θ directions, a camera for photographing said wafer supported by said chuck pin and the alignment mark on said tray for positioning said wafer with respect to said tray, and a camera driving portion for moving the camera to a predetermined position.

8. The wafer prober for semiconductor inspection according to claim 1, wherein
said contact unit is provided with a placement table on which said tray is placed, a probe card provided above of the placement table, facing the placement table, for inspecting a wafer supported on said tray by bringing the probe into contact with the wafer supported by said tray, an air pump for forming a vacuum to fix said tray placed on said placement table and for blowing gas between said placement table and said tray for generating an air floating phenomenon, and a positioning pin provided on said probe card, facing an alignment portion of said tray, for positioning said tray by fitting with the alignment portion.

9. The wafer prober for semiconductor inspection according to claim 8 wherein the alignment portion is a V-groove.

10. An inspection method using a wafer prober for semiconductor inspection, comprising the steps of:
inserting at least three chuck pins of an alignment unit through holes in a tray and into contact with a wafer supported on the tray:
moving the chuck pins in X, Y, Z, and θ directions to move the wafer to a set position with respect to a tray where an alignment mark on the wafer matches an alignment mark on an upper surface of the tray;
selectively transporting said tray which supports said wafer by a tray transport portion to contact units arranged in number larger than that of said alignment units, and bringing a wafer, supported on a tray, into contact with each of the contact units so that a plurality of wafers are inspected in parallel;
aligning said tray relative to a contact unit and a probe of the contact unit by engagement of the contact unit with alignment portions on said tray; and
inspecting the wafer on the aligned tray utilizing the probe.

* * * * *